(12) United States Patent
Liang et al.

(10) Patent No.: US 11,029,476 B2
(45) Date of Patent: Jun. 8, 2021

(54) INJECTION LOCKED MULTI-WAVELENGTH OPTICAL SOURCE

(71) Applicant: Hewlett Packard Enterprise Development LP, Houston, TX (US)

(72) Inventors: Di Liang, Santa Barbara, CA (US); Zhixin Liu, London (GB)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/582,907

(22) Filed: Sep. 25, 2019

(65) Prior Publication Data

US 2021/0088740 A1 Mar. 25, 2021

(51) Int. Cl.
| | |
|---|---|
| *G02B 6/43* | (2006.01) |
| *G02B 6/42* | (2006.01) |
| *H01S 5/10* | (2021.01) |
| *H01S 5/026* | (2006.01) |
| *H01S 5/065* | (2006.01) |
| *G02B 6/293* | (2006.01) |

(Continued)

(52) U.S. Cl.
CPC ............ *G02B 6/43* (2013.01); *G02B 6/29343* (2013.01); *G02B 6/29382* (2013.01); *G02B 6/4215* (2013.01); *H01S 5/026* (2013.01); *H01S 5/0657* (2013.01); *H01S 5/1071* (2013.01); *H01S 5/4025* (2013.01); *H04B 10/503* (2013.01); *H04B 10/67* (2013.01); *H04J 14/02* (2013.01)

(58) Field of Classification Search
CPC .. G02B 6/43; G02B 6/29343; G02B 6/29382; G02B 6/4215; H01S 5/026; H01S 5/0657; H01S 5/1071; H01S 5/4025; H04B 10/503; H04B 10/67; H04J 14/02
USPC ........................................................... 385/37
See application file for complete search history.

(56) References Cited

U.S. PATENT DOCUMENTS

| 5,530,709 A * | 6/1996 | Waarts ............... G02B 6/03605 |
| | | 372/6 |
| 7,099,586 B2 | 8/2006 | Yoo |

(Continued)

OTHER PUBLICATIONS

Fei Wang, "Tunable 12x10 GHz mode-locked semiconductor fiber laser incorporating a Mach-Zehnder interferometer filter", Optics & Laser Technology, vol. 43, Issue 4, Jun. 2011, pp. 848-851.

(Continued)

*Primary Examiner* — Jerry M Blevins
(74) *Attorney, Agent, or Firm* — Hewlett Packard Enterprise Patent Department

(57) ABSTRACT

Examples herein relate to optical systems. In particular, implementations herein relate to an optical system including an optical transmitter configured to transmit optical signals. The optical transmitter includes a first optical source configured to emit light having different wavelengths, a waveguide, and an optical coupler configured to couple the emitted light from the first optical source to the waveguide. The optical transmitter further includes an array of two or more second optical sources coupled to the waveguide, each of the two or more second optical sources configured to be injection locked to a different respective wavelength of the emitted light transmitted via the waveguide from the first optical source. In some implementations, the first optical source is a master comb laser and the two or more second optical sources are slave ring lasers.

19 Claims, 6 Drawing Sheets

(51) Int. Cl.
*H04B 10/50* (2013.01)
*H04B 10/67* (2013.01)
*H01S 5/40* (2006.01)
*H04J 14/02* (2006.01)

(56) References Cited

U.S. PATENT DOCUMENTS

| | | | |
|---|---|---|---|
| 8,842,998 B2 | 9/2014 | Delfyett et al. | |
| 9,088,371 B2 | 7/2015 | Witzens | |
| 9,287,993 B1 | 3/2016 | Huynh et al. | |
| 9,385,506 B2 | 7/2016 | Anandarajah et al. | |
| 10,243,328 B2 | 3/2019 | Zhang et al. | |
| 10,320,515 B1 | 6/2019 | Koch et al. | |
| 2003/0034538 A1* | 2/2003 | Brophy | G02B 6/136 257/444 |
| 2004/0233945 A1 | 11/2004 | Komine et al. | |
| 2005/0013337 A1* | 1/2005 | Jung | H01S 5/4006 372/50.1 |
| 2014/0161148 A1* | 6/2014 | Osinki | H01S 5/4006 372/50.1 |
| 2016/0119057 A1* | 4/2016 | Mekis | H04B 10/40 398/51 |
| 2018/0294622 A1* | 10/2018 | Kurczveil | H01S 5/1032 |
| 2019/0113686 A1* | 4/2019 | Matres | G02B 6/29395 |
| 2019/0310422 A1* | 10/2019 | Seyedi | H04B 10/572 |
| 2020/0119813 A1* | 4/2020 | Zhang | H04B 10/63 |

OTHER PUBLICATIONS

Geza et al., "On-chip Hybrid Silicon Quantum Dot Comb Laser with 14 Errorfree Channels", HPE, Jul. 2018, 3 pages.
Kobayashi et al., "Automatic frequency control in a semiconductor laser and an optical amplifier," in Journal of Lightwave Technology, vol. 1, No. 2, Jun. 1983, pp. 394-402.
Liang et al., "Heterogeneous silicon light sources for datacom applications", Optical Fiber Technology, vol. 44, 2018, pp. 43-52.
Luecke et al., "Autostable injection locking of a 4x4 VCSEL array with on-chip master laser", SPIE Digital Library, May 1, 2000, 7 pages.
Pintus et al., "Broadband TE Optical Isolators and Circulators in Silicon Photonics Through Ce:YIG Bonding", Journal of Lightwave Technology, vol. 37, No. 5, Mar. 1, 2019, pp. 1463-1473.
RP Photonics "Encyclopedia of Laser Physics and Technology—injection locking, single-frequency laser", available online at <https://web.archive.org/web/20160419031911/https://www.rp-photonics.com/injection_locking.html>, Apr. 19, 2016, 2 Pages.
Vasseur et al., "Alternate Multiwavelength Picosecond Pulse Generation by Use of an Unbalanced Mach-Zehnder Interferometer in a Mode-locked Fiber Ring Laser", IEEE Journal of Quantum Electronics, vol. 43, No. 1, Jan. 2007, pp. 85-96.
Vasseur, J. et al., "Alternate Multiwavelength Modelocked Fiber Laser", IEEE Photonics Technology Letters, vol. 16, No. 8, Aug. 2004 , pp. 1816-1818.

* cited by examiner

INJECTION LOCKED MULTI-WAVELENGTH OPTICAL SOURCE

BACKGROUND

Optoelectronic communication (e.g., using optical signals to transmit electronic data) is becoming more prevalent as a potential solution, at least in part, to the ever increasing demand for high bandwidth, high quality, and low power consumption data transfer in applications such as high performance computing systems, large capacity data storage servers, and network devices. Wavelength division multiplexing (WDM) is useful for increasing communication bandwidth by combining and sending multiple different data channels or wavelengths from one or more optical sources over an optical fiber. Generally, optical systems or transmitters include an optical source configured to emit one or more wavelengths via which data signals are transferred. An improved optical system or transmitter having an injection locked multi-wavelength optical source as described herein may provide one or more of the following advantages: improved power output across multiple wavelengths, increased direct modulation bandwidth, reduced narrow linewidth with low frequency and phase noise, amplification of individual tones with relatively low noise, higher total power handling capability before saturation, heterogeneous or monolithic integration on a same chip, or a reduced footprint.

BRIEF DESCRIPTION OF THE DRAWINGS

Certain examples are described in the following detailed description and in reference to the drawings, in which.

DETAILED DESCRIPTION OF SPECIFIC EXAMPLES

The present disclosure describes various examples of optical systems (e.g., optical transceivers) that include an optical transmitter having an injection locked multi-wavelength optical source. According to embodiments as described herein, the injection locked multi-wavelength optical source includes a first optical source configured to emit light having different wavelengths, a waveguide, and an optical coupler configured to couple the emitted light from the first optical source to the waveguide. The injection locked multi-wavelength optical source further includes an array of two or more second optical sources coupled to the waveguide. Each of the two or more second optical sources are configured to be injection locked to a different respective wavelength of the emitted light transmitted via the waveguide from the first optical source. In some implementations, the first optical source is a master comb laser and the two or more second optical sources are slave ring lasers of the injection locked multi-wavelength optical source.

Injection locking two or more (e.g., multiple) slave ring lasers to a single or same master comb laser can reduce an overall footprint of an optical system including such an injection locked multi-wavelength optical source as provided herein as well as costs associated with additional master lasers relative to systems that include slave ring lasers injection locked to different respective master lasers. For example, the multiple slave lasers can be injection locked by a single master laser to boost or amplify multiple wavelengths using a single master laser. Further advantages and improvements with respect to certain implementations of the optical system or injection locked multi-wavelength optical source are discussed in more detail below.

An "optical fiber" as described herein can refer to a single optical fiber (e.g., including a core, a cladding, a buffer and one or more layers of protective jackets) to provide bidirectional optical communication (e.g., both transmit and receive communications in an optical network). A signal or communication path of an optical fiber can extend contiguously and uninterrupted between optical modules. In some examples, the optical fiber includes two or more fibers connected (e.g., sequentially) via fiber-to-fiber connections such that the fibers function or perform as a single communication path. To avoid unnecessarily obscuring the description, conventional or well-known structures and components of optical systems are omitted from the description, for example, optical connectors, tuning circuitry, sensors, and CMOS drivers/receivers to tune, convert, or modulate optical signals or resonators.

Figure 1A:
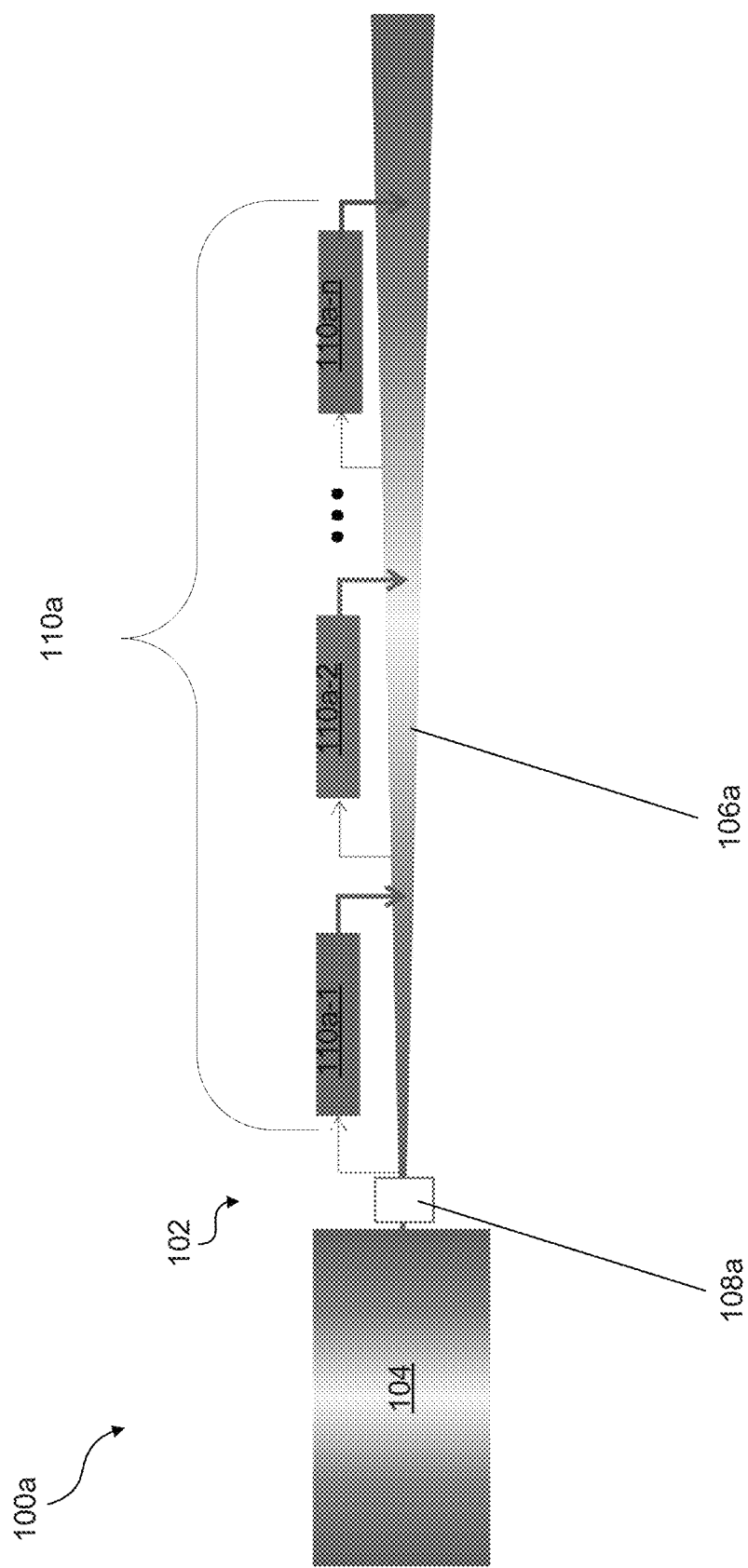
FIGS. 1A-1B schematically illustrate examples of optical systems according to the present disclosure.
Figure 1B:
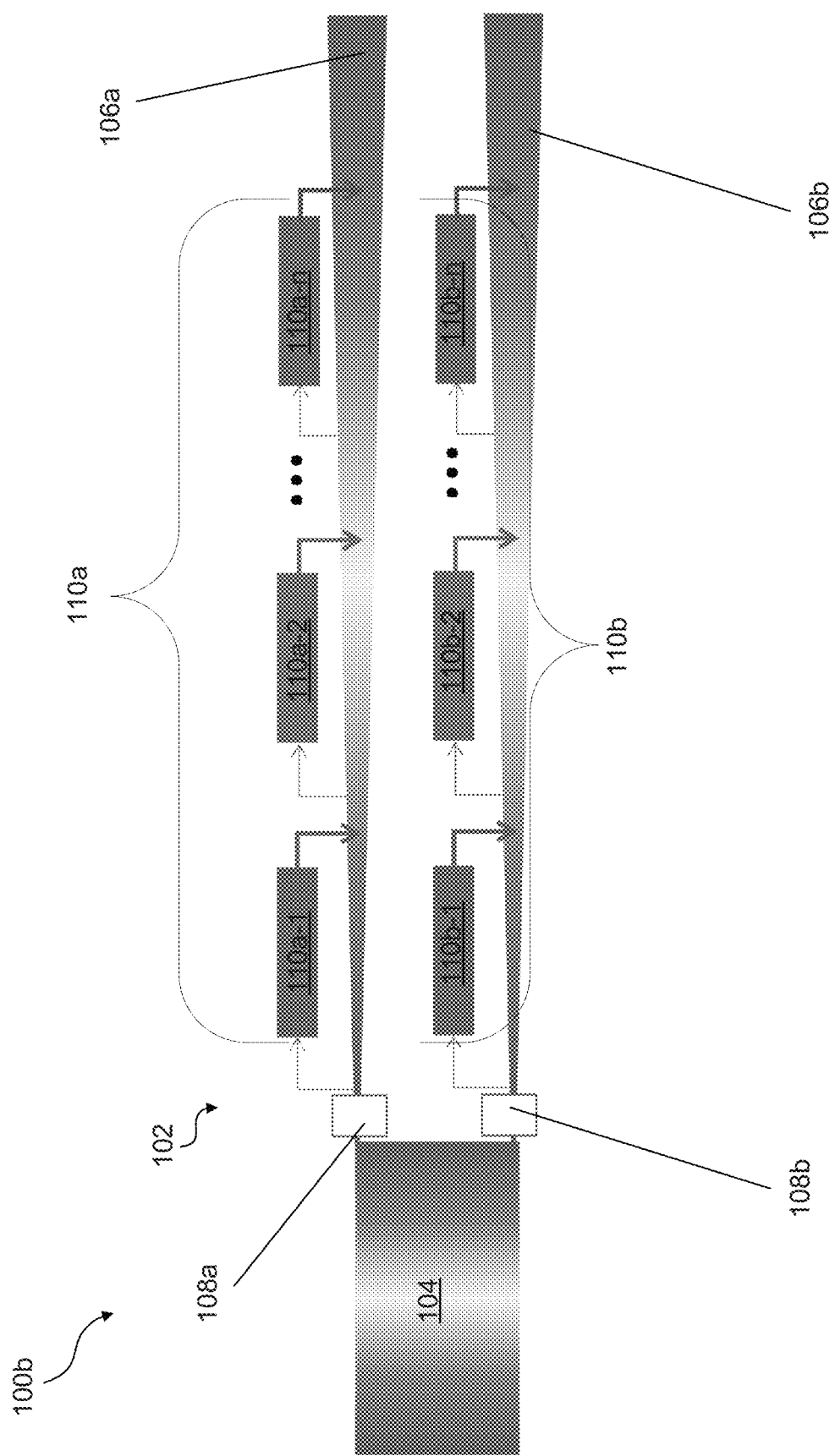

FIGS. 1A-1B illustrate examples of optical systems 100a and 100b (referred to herein collectively as optical system 100 to simplify the description of similar or identical components of optical system 100a and 100b) and components thereof according to the present disclosure. The optical system 100 includes an optical transmitter 102 configured to transmit optical signals. The optical transmitter 102 includes at least one first optical source 104 configured to emit light (e.g., carrier waves) having different wavelengths or channels. The optical transmitter 102 includes a waveguide 106a and an optical coupler 108a configured to couple the emitted light from the first optical source 104 to the waveguide 106a. The waveguide 106a can be, for example, a bus waveguide. The optical coupler 108a can be, for example, a grating coupler. In other examples, the optical coupler 108a can include, but is not limited to a: prism, collimating lens, light-turn lens, parabolic reflector, spot-size converter, inversely tapered waveguide, bent waveguide, or a combination thereof.

The optical transmitter 102 further includes an array of two or more second optical sources 110a (e.g., up to n number of optical sources, where n can equal four, eight, sixteen, thirty-two, sixty-four) coupled to the waveguide 106a. The two or more second optical sources are identified individually as second optical sources 110a-1, 110a-2, up to 110a-n, respectively. Each of the two or more second optical sources 110a are injection locked or configured to be injection locked to a different respective wavelength of the emitted light transmitted via the waveguide 106a from the first optical source 104. As described in further detail below (see FIGS. 2A-2B), the first optical source 104 can include a multi-wavelength comb laser configured to generate a plurality of different laser or comb lines (e.g., tones or wavelengths) and the array of two or more second optical sources can include two or more ring lasers.

As illustrated in FIG. 1B, in some examples, the optical system 100 (e.g., optical system 100b) can include a second waveguide 106b and a second optical coupler 108b configured to couple the emitted light from the first optical source 104 to the second waveguide 106b. Both the second waveguide 106b and the second optical coupler 108b can be configured identically with respect to the waveguide 106a and the optical coupler 108a as described above.

The optical system 100 further includes a second array of two or more second optical sources 110b (e.g., up to n number of optical sources, where n can equal four, eight, sixteen, thirty-two, sixty-four) coupled to the second waveguide 106b. The two or more second optical sources are identified individually as second optical sources 110b-1, 110b-2, up to 110b-n, respectively. Each of the two or more second optical sources 110b are injection locked or configured to be injection locked to a different respective wavelength of the emitted light transmitted via the second waveguide 106b from the first optical source 104. Similar to the first array of two or more second optical sources 110a, the array of two or more second optical sources 110b can include two or more ring lasers.

In some examples, the emitted light from the first optical source 104 is symmetrically output (e.g., with same wavelengths, total number of wavelengths, and same respective power levels) to both the first and second waveguides 106a and 106b such that the first array of two or more second optical sources 110a and the second array of two or more second optical sources 110b are injection locked to the same respective wavelengths of the emitted light. For example, the optical system 100 can include a power splitter to split the optical signals into two sets of symmetric wavelengths outputted to the two waveguides 106a and 106b to be injection locked to the first and second arrays of optical sources 110a and 110b, respectively. In such examples, the power level of the wavelengths symmetrically output to each waveguide can each be one half of the total power level relative to when the light is output to only a single waveguide. In other examples, the emitted light from the first optical source 104 may not be symmetric. In such examples, the power level of the wavelengths can be symmetrically output to the first and second waveguides 106a and 106b via a booster amplifier (e.g., an integrated semiconductor optical amplifier) or attenuator positioned between the optical source 104 and the waveguides to equalize the two non-symmetric outputs to the same level prior to entering the waveguides.

In some examples, the optical system 100 includes an optical splitter to split the wavelengths of the light emitted from the first optical source between the first and second waveguides such that the first array of two or more second optical sources and the second array of two or more second optical sources are injection locked to two different sets of respective wavelengths of the emitted light from the first optical source 104. In some examples, as described in more detail with respect to FIG. 3, any of the optical systems as described herein can include an optical receiver configured to receive the optical signals from the optical transmitter via an optical link (e.g., an optical fiber).

Figure 2A:
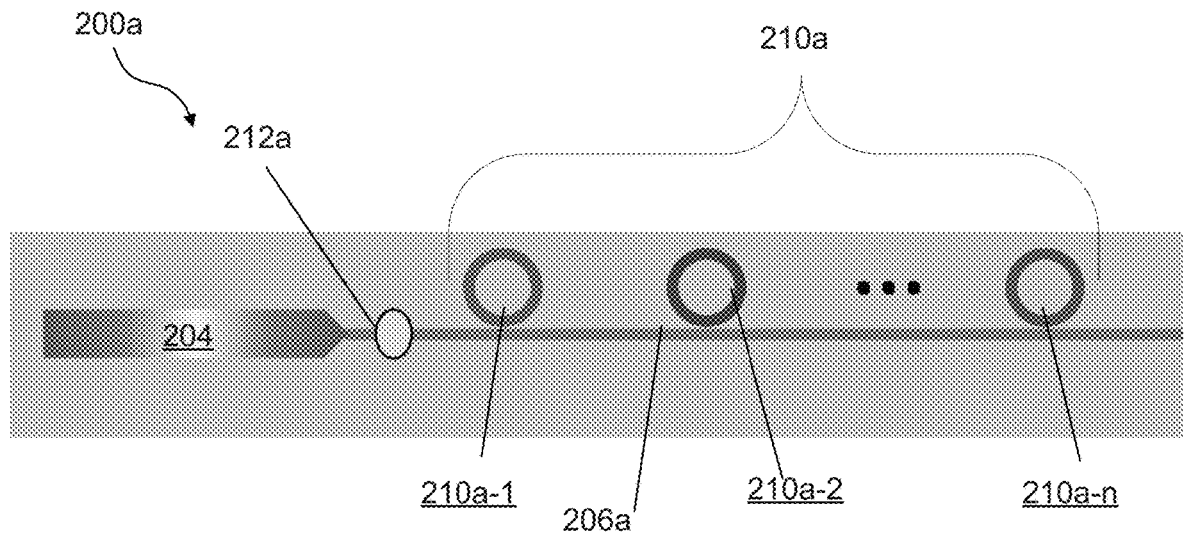
FIGS. 2A-2C schematically illustrate examples of injection locked multi-wavelength optical sources that can be implemented with any of the optical systems described herein according to the present disclosure.
Figure 2B:
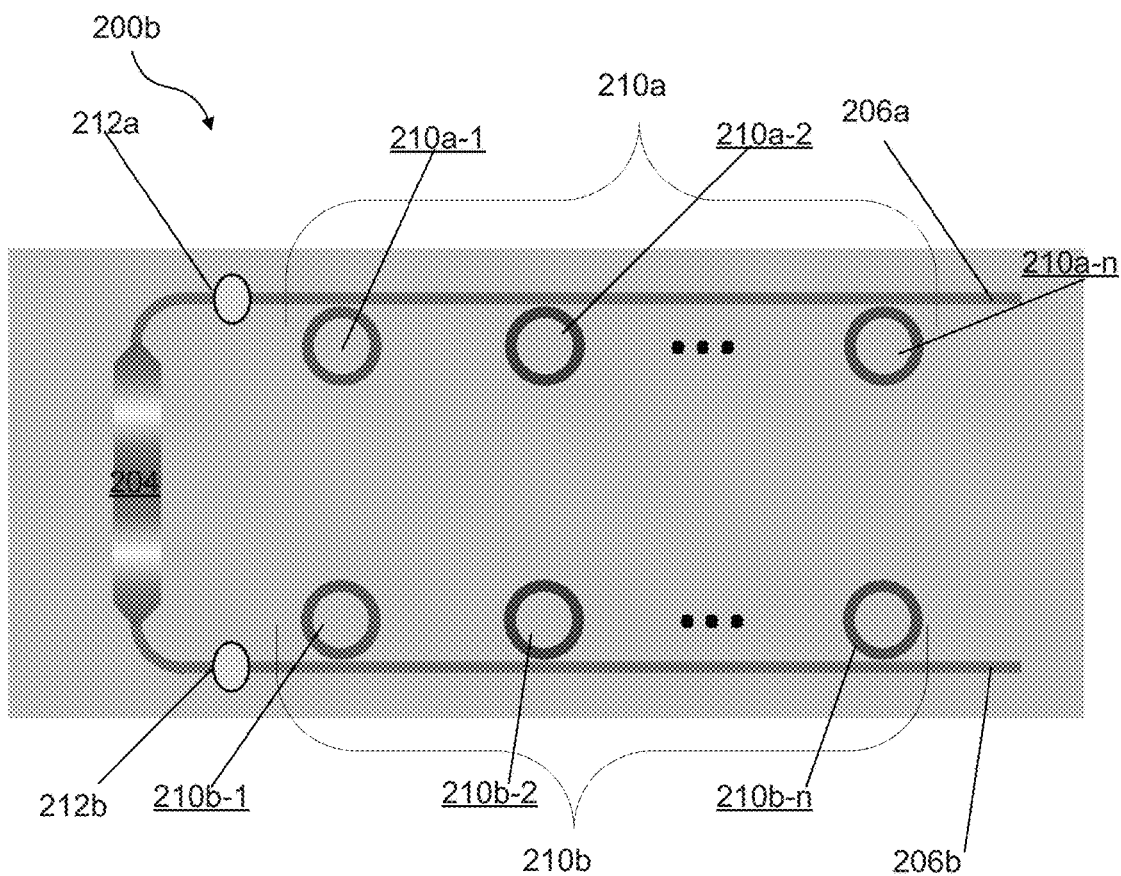
Figure 2C:
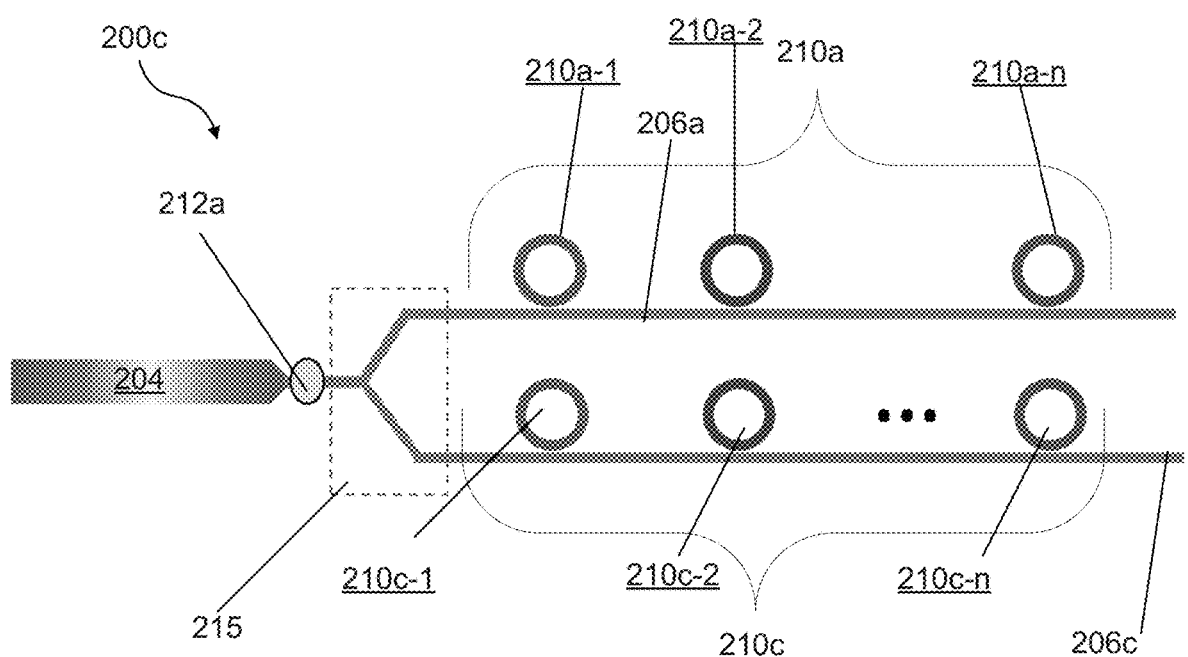

With reference to FIGS. 2A-C together, examples of injection locked multi-wavelength optical sources 200a, 200b, 200c are illustrated that can be implemented with any of the optical systems (e.g., optical systems 100a, 100b, 300) and transmitters (e.g., optical transmitter 102 and 302) as described herein. Injection locked multi-wavelength optical sources 200a-200c are referred to herein collectively as injection locked multi-wavelength optical sources 200 to simplify the description of similar or identical components of such sources respectively. Injection locked multi-wavelength optical source 200 includes a master comb laser 204 configured to emit light having multiple different wavelengths. As described above, the master comb laser 204 can generate a plurality of different laser or comb lines (e.g., wavelengths or tones).

The injection locked multi-wavelength optical source 200 includes an array of two or more slave ring lasers 210a (e.g., up to n number of slave ring lasers, where n can equal four, eight, sixteen, thirty-two, sixty-four). The two or more slave ring lasers are identified individually as slave ring lasers 210a-1, 210a-2, up to 210a-n, respectively. Each slave ring laser 210a is injection locked to a different respective wavelength of the emitted light from the master comb laser 204. In other words, the single master comb laser 204 can be injection locked to multiple slave ring lasers 210a boosting or amplifying multiple wavelengths.

In some examples, the master comb laser 204 and the array of two or more slave ring lasers 210a are formed on or within a single chip. For example, the master comb laser 204 and the array of two or more slave ring lasers 210a can be heterogeneously integrated on a silicon or silicon on insulator substrate. In some examples, the master comb laser 204 and the array of two or more slave ring lasers 210a can be monolithically grown or formed on a silicon or silicon on insulator substrate.

In some examples, the injection locked multi-wavelength optical source 200 can include one or more optical isolators 212 (e.g., identified individually as optical isolators 212a and 212b) positioned between the master comb laser 204 and the slave ring lasers (e.g., slave ring lasers 210a and 210b) to prevent reflections, light feedback or light from the slave ring lasers from entering a laser cavity of the master comb laser 204 (e.g., ensure unidirectional lasing from the master comb laser 204 to the injection locked slave ring lasers 210a and 210b). In other examples, the slave ring lasers described herein are injection locked to the master comb laser 204 without the optical isolator 212 positioned therebetween. For example, the light from the maser comb laser 204 injected-locked into the slave ring lasers 210a and 210b can provide sufficient optical gain to the one or more slave ring lasers to ensure stable undirectional lasing in a same direction of optical injection (e.g., only from master comb laser to slave ring laser) without an optical isolator therebetween.

As illustrated in FIG. 2B, in some examples, the injection locked multi-wavelength optical source 200 (e.g., injection locked multi-wavelength optical source 200b) can include a second array of two or more slave ring lasers 210b (e.g., up to n number of slave ring lasers, where n can equal four, eight, sixteen, thirty-two, sixty-four). The two or more slave ring lasers are identified individually as slave ring lasers 210b-1, 210b-2, up to 210b-n, respectively. Each slave ring laser 210b is injection locked to a different respective wavelength of the emitted light transmitted from the master comb laser 204.

In some examples, the emitted light from the master comb laser 204 is symmetrically output to the first and second arrays of two or more slave ring lasers 210a and 210b (e.g., with a power splitter) such that the first and second arrays of two or more slave ring lasers 210a and 210b are injection locked to same respective wavelengths of the emitted light. In some examples, the light from the master comb laser 204 is not symmetrically outputted. However, as described above, the power level of the wavelengths can be symmetrically output to the first and second arrays via a booster amplifier (e.g., an integrated semiconductor optical amplifier) or attenuator positioned between the master comb laser 204 and the first and second arrays to equalize the two non-symmetric outputs to the same level prior to entering the slave ring lasers 210a and 210b.

In other examples, the emitted light from the master comb laser 204 is non-symmetrically output to the first and second arrays of two or more slave ring lasers 210a and 210b (e.g., with an optical splitter) such that the first array of two or more slave ring lasers 210a and the second array of two or more slave ring lasers 210b are injection locked to two different sets of respective wavelengths of the emitted light from the master comb laser 204.

As illustrated in FIG. 2C, in some examples, the injection locked multi-wavelength optical source 200 (e.g., injection locked multi-wavelength optical source 200c) can include a second array of two or more slave ring lasers 210c (e.g., up to n number of slave ring lasers, where n can equal four, eight, sixteen, thirty-two, sixty-four). The two or more slave ring lasers are identified individually as slave ring lasers 210c-1, 210c-2, up to 210c-n, respectively. Each slave ring laser 210c is injection locked to a different respective wavelength of the emitted light transmitted from the master comb laser 204.

The multi-wavelength optical source 200 includes a passive power splitter 215 (e.g., a y-branch waveguide, 1×2 multi-mode interferometer) to further increase the number of slave ring laser arrays by splitting the emitted light transmitted from the master comb laser 204 to two separate slave ring laser arrays (e.g., first array and second array of slave ring lasers 210a and 210c). The passive power splitter 215 can be implemented into the example of FIG. 2B as well (e.g., providing two passive power splitters or a 1×4 multi-mode interferometer) to further increase the number of slave ring laser arrays (e.g., from two to four).

The slave ring lasers (e.g., 210a-210c) referred to collectively herein as slave ring lasers 210 can be directly-modulated ring lasers. For example, the slave ring lasers can be directly modulated quantum dot (QD) microring lasers having micro-cavities tunable (e.g., via bias or thermal tuning) to different resonant wavelengths corresponding to different respective wavelengths of the light emitted from the master comb laser 204.

Injection locking each of the slave ring lasers 210 to single, different tones or wavelengths of the light emitted from the single master comb laser 204 can result in one or more of the following advantages: direct modulation bandwidth extension can be increased by or up to 10 times for each slave ring laser 210 relative to non-injection locked ring lasers, the slave ring lasers 210 can have reduced narrow linewidth with low relative frequency and phase noise, or amplification of individual tones with relatively high gain (e.g., up to or including 50 dB) with low add noise relative to, for example, a semiconductor optical amplifier. Further, an array of slave ring lasers has a more compact footprint relative to a semiconductor optical amplifier.

The resonance characteristics of the injection locked slave ring lasers 210 can also provide energy-efficient and selective amplification of individual wavelengths output or emitted from the master comb laser 204 with little added noise and high saturation power (e.g., due to each ring only amplifying a single wavelength and not the entire spectrum of wavelengths or comb) of the master comb laser 204. Each ring laser 210 can also be biased differently (e.g., independently of the other ring lasers at different biasing currents) to equalize a comb shape of the master comb laser 204 (e.g., such that the power level across the different wavelengths of the slave ring lasers 210 are equivalent or substantially equivalent As described above with respect to the optical system 100, the injection locked multiple-wavelength source 200 can include a waveguide optically coupling the master comb laser 204 and the slave ring laser 210. Individual wavelengths of the master comb laser 204 injection locked to the different slave ring lasers 210 can be modulated with electrical data signals (e.g., modulated via tuning circuitry and external or integrated CMOS drivers) and sent to an optical receiver (e.g., via an optical fiber) as described in more detail below with respect to optical system 300.

Figure 3:
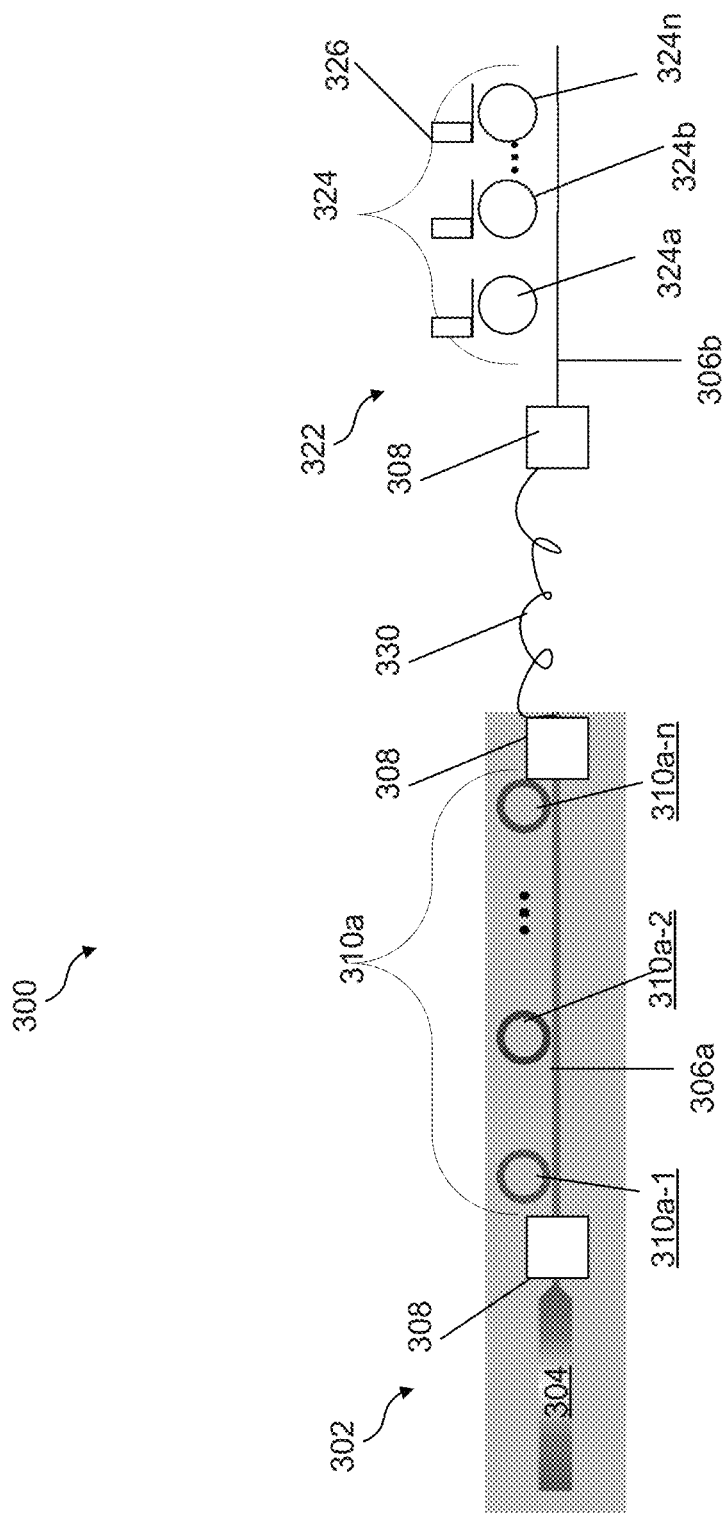
FIG. 3 schematically illustrates other examples of optical systems according to the present disclosure.

As illustrated in FIG. 3, optical system 300 includes an optical transmitter 302 coupled to an optical receiver 322 via an optical fiber 330 (e.g., forming a WDM optical link). The optical transmitter 302 can be configured similarly or identically to the optical transmitter 102 as described above. The optical transmitter includes one or more components, in whole or in part, as optical transmitter 102 (e.g., waveguide 306a and one or more optical couplers 308). The wavelengths from each second optical source 310 can be multiplexed and sent across the optical fiber 330 to be demultiplexed and converted from the optical domain to the electrical domain by the optical receiver 322.

The optical receiver 322 includes a waveguide 306b and an array of ring resonators 324 (identified individually as ring resonators 324a, 324b, up to 324n) coupled to the waveguide 306b. Opposing ends of the optical fiber 330 are coupled to the waveguide 306a and 306b, respectively. Each of the ring resonators 324 are configured to be tuned to different resonant wavelengths respectively corresponding to different wavelengths of the emitted light from the first optical source 304 of the optical transmitter 302 and injection locked to the array of second optical sources 310. The optical receiver 322 further includes an array of photodetectors 326. Each photodetector 326 is coupled to a respective ring resonator of the array of ring resonators 324. In some examples, each photodetector 326 is integrated with the respective ring resonator 324 to form an array of wavelength-selective photodetectors.

Resonance properties of each ring resonator 324 can be precisely tuned to select the specific wavelength by varying the radius of each ring or by tuning the cladding index. Tuning can be accomplished via thermal tuning (e.g., providing a controllable micro-heater by each ring resonator), bias-tuning, or a combination of both. While referring specifically to ring resonators, in other examples, ring resonators as described herein can be replaced with microdisks or other suitable traveling wave resonators.

The ring resonators 324 act as filters to drop the respective resonant wavelengths from the respective waveguides 306a and 306b. The array of ring resonators 324 receives the multi-wavelength optical signals from the first optical source 304 and optically injected into and modulated by the array of second optical sources 310. Resonant wavelengths specific or corresponding to each ring resonator 324 are individually demultiplexed into separate photodetectors 326 (e.g., via "drop" or output waveguides) to convert the optical signals into electrical signals (e.g., for further processing). Thus, each of the ring resonators 324 can "drop" or otherwise filter a single wavelength of modulated light or signals from the multiplexed optical signals having multi-wavelengths of light received across the optical fiber 330.

Further, in some examples, the optical transmitter 302 can include filter or filter blocks configured to filter out or remove unusable wavelengths of light (e.g., wavelengths with no corresponding second optical source 310). For example, such filters can be positioned or otherwise disposed between the optical couplers 308 and the waveguides 306 (e.g., before or after any of the optical couplers 308). In some examples, the filters or filter blocks are disposed in a position or location before wavelengths of light emitted from the first optical source 304 reach the second optical sources 310. The optical system 300 can further include control logic to tune the individual second optical sources 310 or ring resonators 324 such that they are locked to respective wavelengths of first optical source 304.

Figure 4:
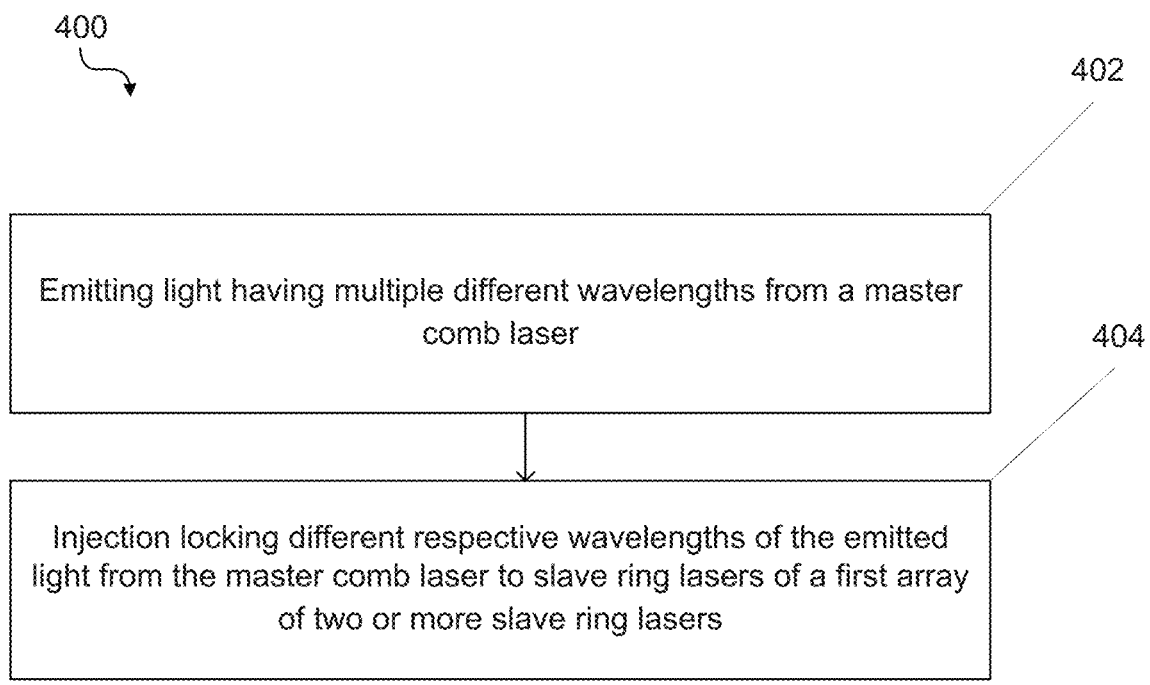
FIG. 4 is a flowchart schematically illustrating an example method of transmitting optical signals via an injection locked multi-wavelength source as described herein according to the present disclosure.

FIG. 4 is a flowchart illustrating a method of transmitting optical signals 400. The method 400 can include or more of the following steps. In some examples, the method 400 includes emitting light having multiple different wavelengths from a master comb laser 402. The method 400 includes injection locking different respective wavelengths of the emitted light from the master comb laser to slave ring lasers of a first array of two or more slave ring lasers 404. In some examples, the two or more slave ring lasers are injection locked to the master comb laser without an optical isolator positioned therebetween. In yet other examples, the method 400 includes symmetrically outputting the emitted light from the master comb laser to the first array of two or more slave ring lasers and a second array of two or more slave ring lasers such that the first and second arrays of two or more slave ring lasers are injection locked to same respective wavelengths of the emitted light.

An improved multi wavelength injection-locked source and methods thereof as described herein can be used to provide directly modulated QD lasers for use in high-speed optical links by increasing direct modulation bandwidth of each slave ring laser. Additionally, by reducing or narrowing optical gain spectral bandwidth of the respective slave ring lasers via injection locking with a master comb laser, single wavelength operation in such slave ring lasers can be achieved. Output power of each of the wavelengths of the master comb laser can be increased via the improved systems and methods described herein.

In the foregoing description, numerous details are set forth to provide an understanding of the subject disclosed herein. However, implementations can be practiced without some or all of these details. Other implementations can include additions, modifications, or variations from the details discussed above. It is intended that the appended claims cover such modifications and variations. The specification and drawings are, accordingly, to be regarded as illustrative rather than restrictive.

It will be recognized that the terms "comprising," "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect (e.g., having additional intervening components or elements), between two or more elements, nodes, or components; the coupling or connection between the elements can be physical, mechanical, logical, optical, electrical, or a combination thereof.

In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

The invention claimed is:

1. An optical system comprising:
   an optical transmitter configured to transmit optical signals, the optical transmitter comprising:
   a first optical source configured to emit light having different wavelengths;
   a waveguide;
   an optical coupler configured to couple the emitted light from the first optical source to the waveguide; and
   an array of two or more second optical sources coupled to the waveguide, each of the two or more second optical sources configured to be injection locked to a different respective wavelength of the emitted light from the first optical source, the emitted light transmitted via the waveguide coupling the first optical source to the array of two or more second optical sources; and
   an optical receiver configured to receive the optical signals from the optical transmitter via an optical link after different respective wavelengths of the emitted light are injected into the respective two or more second optical sources, the optical receiver comprising:
   a second waveguide;
   an array of ring resonators coupled to the second waveguide and configured to be tuned to different resonant wavelengths respectively corresponding to different wavelengths of the emitted light from the first optical source; and
   an array of photodetectors, each photodetector coupled to a respective ring resonator of the array of ring resonators.

2. The optical system of claim 1, wherein the first optical source comprises a multi-wavelength comb laser.

3. The optical system of claim 2, wherein the array of two or more second optical sources comprises two or more ring lasers.

4. The optical system of claim 3, wherein the two or more ring lasers are injection locked to the first optical source without an optical isolator positioned therebetween.

5. The optical system of claim 3, wherein the waveguide comprises a bus waveguide, the two or more ring lasers being coupled to the bus waveguide.

6. The optical system of claim 1, wherein the optical coupler comprises a grating coupler.

7. The optical system of claim 1, further comprising:
   a second waveguide;
   a second optical coupler configured to couple the emitted light from the first optical source to the second waveguide; and
   a second array of two or more second optical sources coupled to the second waveguide, each of the two or more second optical sources configured to be injection locked to a different respective wavelength of the emitted light transmitted via the second waveguide from the first optical source.

8. The optical system of claim 7, wherein the emitted light from the first optical source is symmetrically output to the first and second waveguides such that the first array of two or more second optical sources and the second array of two or more second optical sources are injection locked to same respective wavelengths of the emitted light.

9. The optical system of claim 7, further comprising an optical splitter to split the wavelengths of the light emitted from the first optical source between the first and second waveguides such that the first array of two or more second optical sources and the second array of two or more second optical sources are injection locked to different respective wavelengths of the emitted light.

10. The optical system of claim 7, wherein the two or more second optical sources of the array and the two or more second optical sources of the second array comprise ring lasers injection locked to the first optical source without respective optical isolators positioned therebetween.

11. The optical system of claim 1, wherein each photodetector is integrated with the respective ring resonator to form an array of wavelength-selective photodetectors.

12. An injection locked multi-wavelength optical source comprising:
- a master comb laser configured to emit light having multiple different wavelengths;
- an array of two or more slave ring lasers, wherein each slave ring laser is injection locked to a different respective wavelength of the emitted light from the master comb laser; and
- a waveguide coupled to both the master comb laser and the array of two or more slave ring lasers, the emitted light from the master comb laser being transmitted via the waveguide to the array of two or more slave ring lasers.

13. The injection locked multi-wavelength optical source of claim 12, wherein the master comb laser and the array of two or more slave ring lasers are formed on or within a single chip.

14. The injection locked multi-wavelength optical source of claim 12, wherein the master comb laser and the array of two or more slave ring lasers are heterogeneously integrated on a silicon on insulator substrate.

15. The injection locked multi-wavelength optical source of claim 12, wherein the slave ring lasers are injection locked to the master comb laser without an optical isolator positioned therebetween.

16. The injection locked multi-wavelength optical source of claim 12, further comprising a second array of two or more slave ring lasers, wherein each slave ring laser is injection locked to a different respective wavelength of the emitted light transmitted from the master comb laser, and wherein the emitted light from the master comb laser is symmetrically output to the first and second arrays of two or more slave ring lasers such that the first and second arrays of two or more slave ring lasers are injection locked to same respective wavelengths of the emitted light.

17. A method of transmitting optical signals comprising:
- emitting light having multiple different wavelengths from a master comb laser;
- injection locking different respective wavelengths of the emitted light from the master comb laser to slave ring lasers of a first array of two or more slave ring lasers, the emitted light from the master comb laser transmitted to the first array of two or more slave ring lasers via a waveguide coupled to both the master comb laser and the first array of two or more slave ring lasers.

18. The method of claim 17, wherein the two or more slave ring lasers are injection locked to the master comb laser without an optical isolator positioned therebetween.

19. The method of claim 17, further comprising:
- symmetrically outputting the emitted light from the master comb laser to the first array of two or more slave ring lasers and a second array of two or more slave ring lasers such that the first and second arrays of two or more slave ring lasers are injection locked to same respective wavelengths of the emitted light.

* * * * *